(12) United States Patent
Ohmi et al.

(10) Patent No.: US 6,258,244 B1
(45) Date of Patent: Jul. 10, 2001

(54) TREATING METHOD AND APPARATUS UTILIZING CHEMICAL REACTION

(75) Inventors: Tadahiro Ohmi, 1-17-301, Komegafukuro 2-chome, Aoba-ku, Sendai-shi, Miyagi-ken; Nobuyoshi Tanaka, Tokyo; Takeo Ushiki; Toshikuni Shinohara, both of Sendai; Takahisa Nitta, Fuchu, all of (JP)

(73) Assignees: Canon Kabushiki Kaisha; Ultraclean Technology Research Institute; Tadahiro Ohmi, all of Tokyo (JP)

( * ) Notice: Subject to any disclaimer, the term of this patent is extended or adjusted under 35 U.S.C. 154(b) by 0 days.

(21) Appl. No.: 09/076,834

(22) Filed: May 13, 1998

(30) Foreign Application Priority Data

May 14, 1997 (JP) .................................................. 9-123783

(51) Int. Cl.$^7$ .............................. C25D 9/00; C25D 11/00; C25D 5/00
(52) U.S. Cl. ............................................. 205/333; 205/80
(58) Field of Search .............................. 205/80, 334, 687, 205/799; 204/266

(56) References Cited

U.S. PATENT DOCUMENTS

| | | | |
|---|---|---|---|
| 4,891,103 | 1/1990 | Zorinsky et al. | 204/1 T |
| 5,338,416 | * 8/1994 | Mlcak et al. | 204/129.3 |
| 5,443,727 | * 8/1995 | Gagnon | 210/490 |
| 5,458,755 | * 10/1995 | Fujiyama et al. | 204/224 R |
| 5,464,509 | * 11/1995 | Mlcak et al. | 204/129.3 |

FOREIGN PATENT DOCUMENTS

| | | |
|---|---|---|
| 2615036 | * 10/1988 | (FR) . |
| 2 615 036 | 11/1988 | (FR) . |
| 5-102445 | 4/1993 | (JP) . |
| 5-217820 | 8/1993 | (JP) . |
| 5-217821 | 8/1993 | (JP) . |
| 5-217992 | 8/1993 | (JP) . |
| 5-275329 | 10/1993 | (JP) . |
| 5-275663 | 10/1993 | (JP) . |
| 6-342784 | 12/1994 | (JP) . |
| 7-235651 | 9/1995 | (JP) . |
| 7-249749 | 9/1995 | (JP) . |
| 8-031460 | 2/1996 | (JP) . |

OTHER PUBLICATIONS

Patent Abstracts of Japan, vol. 013, No. 378 (E–809), Aug. 22, 1989.
Chohrin, et al., "Adsorbate effects . . . porous silicon", Appl. Phy. Lett., 64, 4, pp. 481–481 (1994). No Month Available.
R.C. Anderson, et al., "Investigations of porous silicon for vapor sensing", Sensors & Actuators, A21–A23, pp. 835–839 (1990). No Month Available.

* cited by examiner

Primary Examiner—Kathryn Gorgos
Assistant Examiner—Erica Smith-Hicks
(74) Attorney, Agent, or Firm—Fitzpatrick, Cella, Harper & Scinto

(57) ABSTRACT

In order to effectively remove gas molecules of a by-product in a chemical reaction in a solution so as to achieve high efficiency, high rate, and uniformity of the chemical reaction in the solution and in order to realize formation of a semiconductor substrate applicable to production of SOI structure and realize formation of a semiconductor substrate in which a light-emitting element or a gas sensor can be formed, on the basis of an inexpensive silicon substrate, the chemical reaction is performed while the concentration of a gas dissolved in a reaction solution in a reaction vessel is always controlled to be not more than the solubility thereof during the reaction.

42 Claims, 7 Drawing Sheets

TREATING METHOD AND APPARATUS UTILIZING CHEMICAL REACTION

BACKGROUND OF THE INVENTION

1. Field of the Invention

The present invention relates to a treating method and apparatus utilizing a chemical reaction and, more particularly to a treating method and apparatus utilizing a chemical reaction, applicable to production of chemical industrial goods and semiconductor goods such as integrated circuits or electron devices.

2. Related Background Art

Treating methods utilizing chemical reactions have been and are currently applied to many chemical industrial goods and also to semiconductor integrated circuits.

Among the chemical reactions, those in a solution are employed in production of many industrial goods because of their peculiar properties different from those of vapor-phase chemical reactions. Among others, electrolysis reaction is the technology for supplying electric energy to an electrolytic cell to cause change in substance at the interface between the electrode and the electrolyte, thereby producing a chemical substance as an objective material. This technology is applied to production of many industrial goods, including smelting of aluminum, copper, or zinc, metal plating, production of hydrogen, oxygen, caustic soda, and chlorine, and so on.

There are recent proposals on the ELTRAN (Epitaxial Layer TRANsfer by bond and etch back porous Si) SOI substrate as a method for producing a semiconductor substrate by use of a chemical reaction in a solution in the semiconductor processes (Japanese Patent Application Laid-Open Nos. 5-102445; 5-217992; 5-217821; 5-217820.; 5-275663; 5-275329; 6-342784; 7-249749; and 7-235651).

These prior art methods utilize electrochemical reactions in solution, for example, anodization, for producing a semiconductor substrate characterized by epitaxially growing single-crystal silicon on one porous surface of a silicon single-crystal substrate. Part or all of the surface has been rendered porous by the anodization process. The method further comprises bonding a surface of this epitaxial layer to an arbitrary support surface and selectively etching the porous portion of the silicon substrate or separating the bonded substrate into the non-porous portion and an SOI substrate at the porous portion.

Since the porous silicon formed by the anodization reaction has an enormous surface area and the surface thereof is active to adsorption of an organic gas, a variety of gas sensors utilizing the property are under research (M. B-Chohrin and A. Kurex, "Absorbate effects on photoluminescence and electrical conductivity of porous silicon," Appl. Phys. Lett., vol. 64, pp. 481–483, 1994; A. Richter, "Design considerations and performance of adsorptive humidity sensor with capacitive readout," The 7th Int. Conf. Solid-State Sensors and Actuators, pp. 310–313, 1993; R. C. Anderson, R. S. Muller, and C. W. Tobias, "Investigations of porous silicon for vapor sensing," Sensors and Actuators, A21–A23 pp. 835–839, 1990; Akira Motohashi, "Change in electrical characteristics of anodized silicon/single-crystal silicon samples against water vapor," IEICE Transactions (C-II), vol. J77-C-II, pp. 213–220, 1995).

As described above, the chemical reactions in a solution are widely used in production of industrial goods, for example, in the chemical industries and the semiconductor industries. Incidentally, from the viewpoint of production of industrial goods, increasing the efficiency of chemical reaction is very important in order to raise economical efficiency of material production or resource savings. Particularly in the semiconductor industry, in terms of cost efficiency, further increase in the rate of such chemical reactions as film formation and etching, as well as in-plane uniformity of chemical reactions for large-diameter silicon wafers, is demanded.

The chemical reaction in a solution, however, involves generation of a reaction by-product, which is a phenomenon of inhibiting increase in efficiency, rate, and uniformity of chemical reactions. That is, presence in the solution of a further reaction by-product formed by the chemical reaction in addition to the objective chemical substance will inhibit progress of the chemical reaction. A typical example is a phenomenon in the electrolysis in an aqueous solution where hydrogen is normally generated at the negative electrode while oxygen is generated at the positive electrode.

Since these reactions compete with deposition of an objective metal or a discharge reaction of an inorganic and organic chemical species, they are also significant in terms of current efficiency. In addition, since they can also change the kinds of reaction products, they have extremely important effects. For example, in the production of a semiconductor substrate utilizing anodization, gas molecules as a reaction by-product inhibit increase in the rate and uniformity of the reaction for forming porous silicon.

In the conventional technology, as described in the examples of Japanese Patent Application Laid-Open No. 5-102445, the gas molecules generated over the solubility thereof in the solution will form bubbles to adhere to a silicon wafer and the like, thereby inhibiting the reaction. Therefore, the process includes a treatment such as adding alcohol as a surfactant or agitating the solution by use of an agitator. Further, as described in the patent gazette of Japanese Patent Publication No. 8-31460, there is also a method of mounting a bubble removing device in a plating apparatus to remove bubbles contained in a plating solution.

These treating methods are temporary solutions, but are not essential solutions. For example, in formation of porous silicon in the production of a semiconductor substrate, pores having diameters of about 10 nm and depths of about 20 $\mu$m need to be formed with restraining fluctuation within ±5% as to the diameters of pores and within ±10% as to the depths of pores in the silicon wafer plane. In addition, this process of formation of a porous silicon layer has to be carried out in one minute, which is a standard process time in recent volume production of semiconductors. Assuming that the wafer size is 6 inches, the diameters of pores are 10 nm, the aperture ratio (area of pores/area of wafer) is 0.3, and the etching rate is 20 $\mu$m/min, the rate of generation of hydrogen is 788 cc/min. This large amount of hydrogen is generated at bottoms of fine and long pores having the diameters of 10 nm and the depths of 20 $\mu$m, i.e., the aspect ratio of pore of 2000. In order to form the porous silicon layer, the reaction solution has to be always supplied to the bottoms of the fine and long pores having the aspect ratio of 2000 while perfectly removing this large amount of hydrogen as the by-product. It is, however, difficult to solve the above problem by such methods as the addition of a surfactant and the use of agitator. Namely, there is no technology achieved yet for producing the industrial goods including the semiconductor substrates, by utilization of a chemical reaction in a solution, with high productivity.

SUMMARY OF THE INVENTION

An object of the present invention is to provide a method and apparatus wherein a chemical reaction is carried out while the concentration of a gas of a reaction by-product dissolved in a reaction solution in a reaction vessel is always maintained to be not more than its solubility during the reaction.

In the present invention, the chemical reaction in a solution may be an electrochemical reaction with supply of an electrical energy from outside and, of course, may be an anodization reaction as a kind of electrochemical reaction. Namely, the solution may be an electrolyte.

In the present invention, in order to always maintain the concentration of a gas of a reaction by-product dissolved in the reaction solution in the reaction vessel to be not more than the solubility during the reaction, the reaction solution is circulated outside the reaction vessel, for example, and it is deaerated during circulation.

Further, it is preferable that during the deaeration the concentration of a gas of a reaction by-product be controlled so as to be not more than 1/10 of the solubility. When the concentration of gas is controlled to be not more than 1/10 of the solubility, for example, in the case of a reaction for forming a porous layer in a surface of a substrate by an anodization reaction where the substrate is held in the reaction vessel, at least one surface of the substrate is kept in contact with the reaction solution, the other surface of the substrate is kept in contact with an electrically conductive solution, a negative voltage is applied to the reaction solution, and a positive voltage is applied to the conductive solution, the porous layer with deep pores having the diameter of 10 nm and the depth of 20 $\mu$m, thus having the aspect ratio of pore of 2000, can be formed in a treatment time of one minute while restraining the variation in the depths of pores within ±3% in a plane of a 6-inch wafer, by maintaining the amount of dissolved hydrogen in the reaction solution at 1/10 of the solubility.

In addition, as an absolute value, the concentration of gas is particularly controlled so as to be not more than 100 ppb. When the concentration of gas is controlled to be not more than 100 ppb, for example, in the reaction for forming the porous layer in the surface of substrate by the anodization reaction where the substrate is held in the reaction vessel, one surface of the substrate is kept in contact with the reaction solution, the other surface of the substrate is kept in contact with the electrically conductive solution, the negative voltage is applied to the reaction solution, and the positive voltage is applied to the conductive solution, the porous layer with deep pores having the diameter of 10 nm and the depth of 20 $\mu$m, thus having the aspect ratio of pore of 2000, can be formed in the treatment time of one minute while restraining the variation in the depths of pores within ±3% in the 6-inch wafer plane.

There are some cases where the same gas as the reaction by-product exists in the reaction solution from the beginning. Such gas should desirably be removed before the reaction. The gas having particularly great effects is the by-product generated in the chemical reaction. This by-product generated in the chemical reaction needs to be removed at the same time as the generation thereof, so that no bubble of the by-product is generated. For that purpose, it is particularly effective to guide the reaction solution to the outside of the reaction system and to perform deaeration outside the system. Accordingly, the deaeration is preferably carried out in a circulation system.

Chemical reactions accompanied by generation of by-products are, for example, electrochemical reactions, anodization reactions, and so on, and the present invention is particularly effective in these chemical reactions.

Particularly, in the case of the reaction of forming the porous layer in the surface of the substrate by the anodization reaction where the substrate is held in the reaction vessel, at least one surface of the substrate is kept in contact with the reaction solution with the other surface of the substrate in contact with the conductive solution, the negative voltage is applied to the reaction solution with the positive voltage applied to the conductive solution, the by-product (gas) will remain in the pores. Especially, this tendency is particularly conspicuous where the diameters of the pores are 20 nm or less, where the depths of pores are 20 $\mu$m or more, and where the aspect ratios of the pores are 1000 or more. As a result, nonuniformity occurs in formation of the pores. This tendency is further enhanced in the case of treatments in a shorter time.

However, in the present invention, even when the diameters of the pores are 10 nm, the depths of the pores are 20 $\mu$m, and the aspect ratios of the pores are 2000, formation of uniform pores can be realized even in the case of the treatment time of one minute.

Further, in the present invention, the reaction solution is preferably isolated from the atmosphere. This is for preventing a gas from mixing from the atmosphere into the reaction solution.

In the present invention, with regard to the deaerating method for the chemical reaction in a solution, the deaeration may be carried out with a deaerating module comprised of a gas-permeable membrane of hollow fibers, either by evacuating the inside of the hollow fibers to a reduced pressure state by means of a vacuum pump or by filling the inside of the hollow fibers with ultrapure water containing no gas molecule at all.

In the present invention, with regard to the temperature of the solution, control within the fluctuation of ±0.5° C. is preferable in terms of enhancement of controllability of the chemical reaction.

Another object of the present invention is to provide a chemical reaction apparatus comprising:

a reaction vessel having a holding means for holding a substrate, for housing a reaction solution and performing a chemical reaction with the substrate therein;

a circulation line for circulating the reaction solution outside the reaction vessel;

a deaerating device provided on the circulation line, for removing a gas from the reaction solution; and a transfer means for transferring the reaction solution in the circulation line.

An example of the chemical reaction apparatus is an apparatus for carrying out the anodization treatment. In a structural example thereof, one surface of a substrate is kept in contact with a reaction solution, the other surface of the substrate is kept in contact with an electrically conductive solution. The apparatus is provided with an electrode for applying a negative voltage to the reaction solution and an electrode for applying a positive voltage to the conductive solution.

According to the present invention, the concentration of gas molecules dissolved in the solution is always controlled so as to be not more than the solubility of said gas molecules. For example, in the pore formation reaction of silicon by anodization, the gas molecules of the by-product are prevented from forming bubbles and then adhering onto silicon, more particularly onto the bottoms of the pores of silicon, which in turn enables the suppression of degradation of chemical reaction rate and occurrence of nonuniform chemical reaction.

According to the present invention, it is possible to perform pore formation in the silicon substrate for use in the field of ordinary semiconductor integrated circuits, with in-plane uniformity and at high speed. Further, according to the present invention, a semiconductor substrate applicable to formation of SOI structure can be produced. In addition, according to the present invention, it is possible to produce a semiconductor substrate in which a light-emitting element or a gas sensor can be formed, on the basis of an inexpensive silicon substrate.

DETAILED DESCRIPTION OF THE PREFERRED EMBODIMENTS

Figure 1:
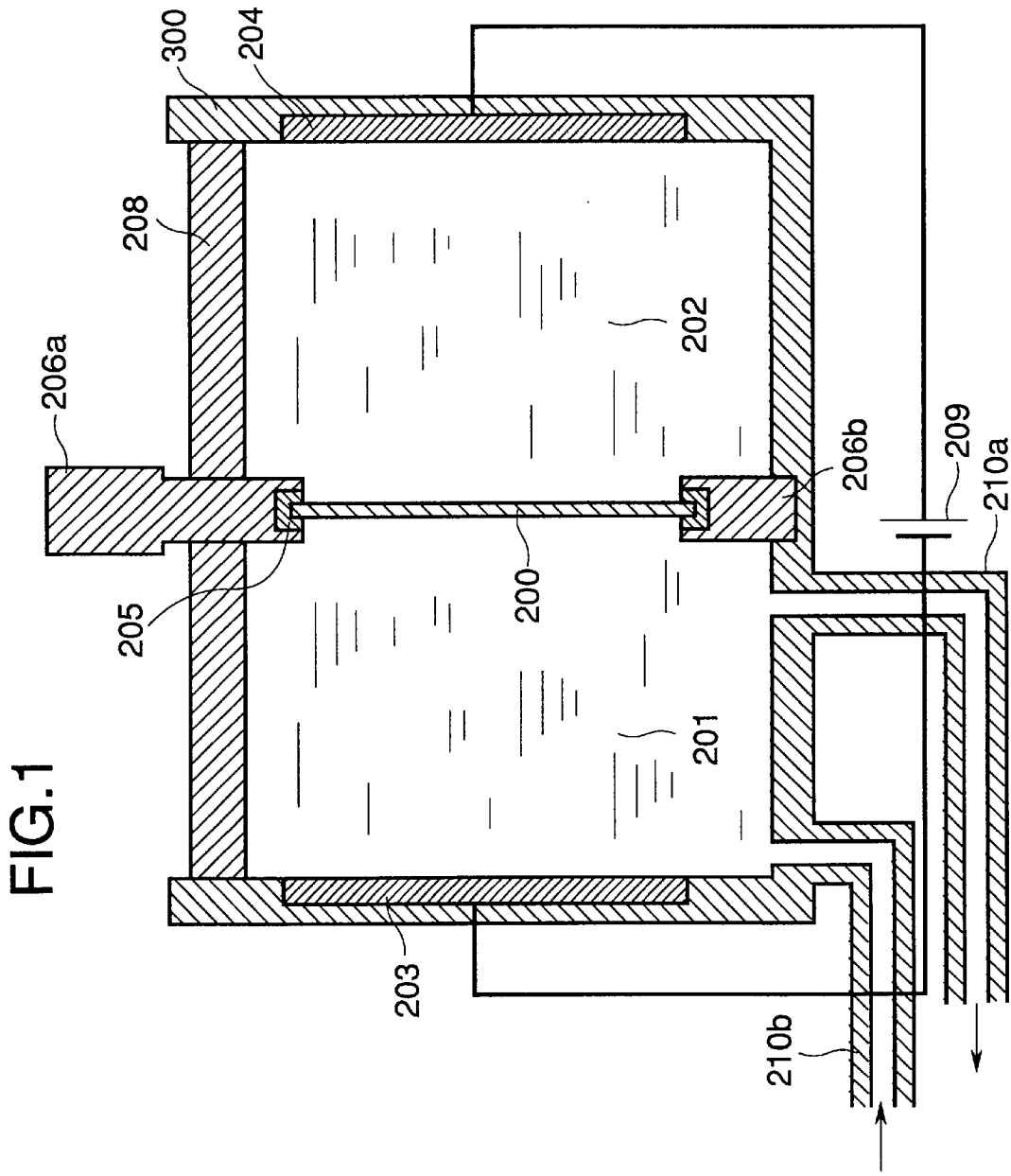
FIG. 1 is a schematic, cross-sectional view of a reaction vessel according to an embodiment of the present invention.
Figure 2:
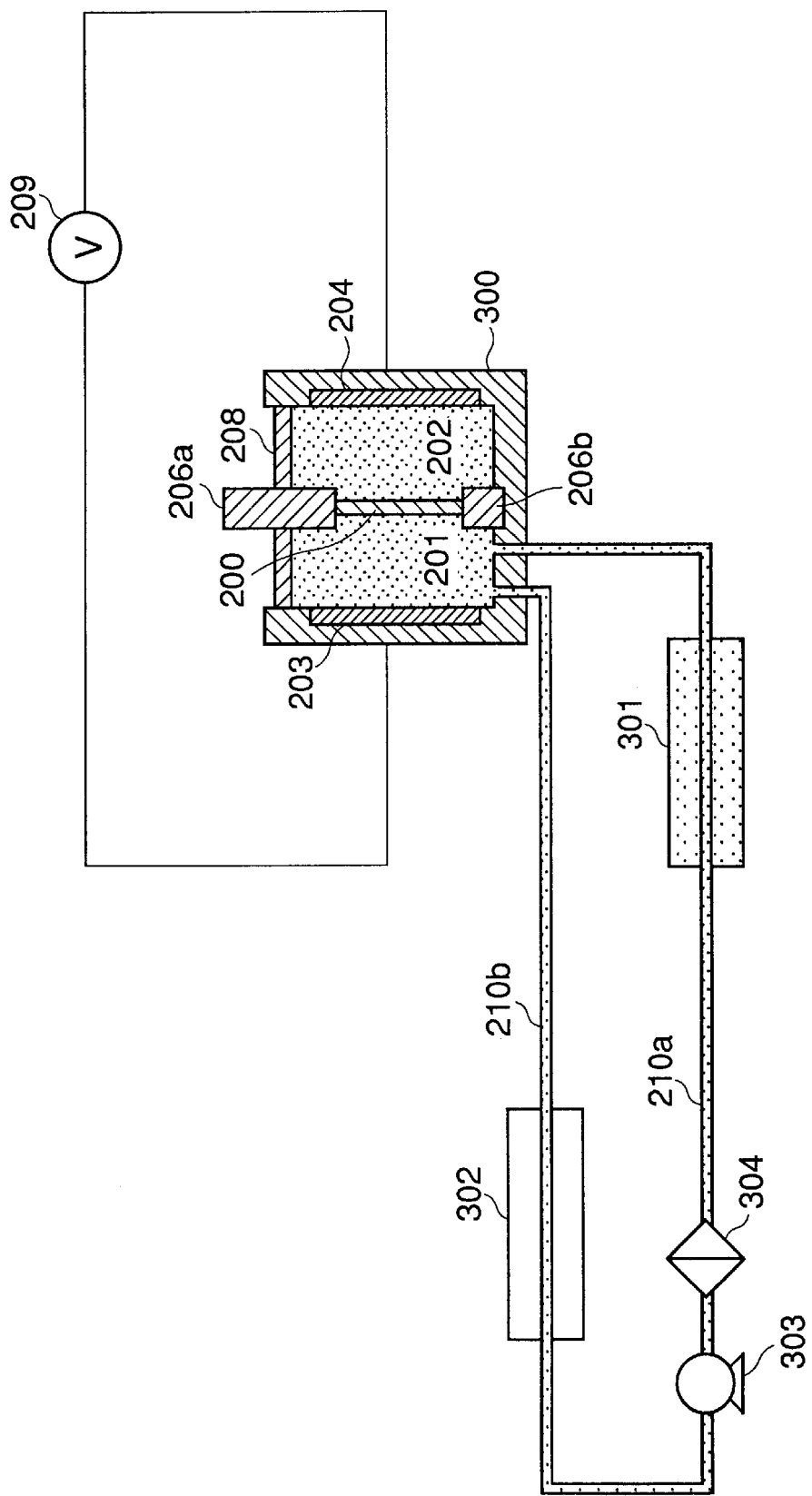
FIG. 2 is a schematic view of a chemical reaction apparatus according to an embodiment of the present invention.

FIG. 1 and FIG. 2 are schematic views showing a chemical reaction apparatus according to a preferred embodiment of the present invention.

The chemical reaction apparatus has a reaction vessel 300 having a holding means 206a, 206b for holding a substrate (for example, a silicon wafer or a substrate with a silicon layer) 200, for housing a reaction solution (for example, a liquid containing hydrofluoric acid) 201 and for performing a chemical reaction with the substrate 200 therein; a circulation line 210a (outward path), 210b (inward path) for circulating the reaction solution 201 outside the reaction vessel 300; a deaerating device 301 provided on the circulation line 210a, for removing a gas from the reaction solution 201; and a transfer pump 303 which is a transfer means for transferring the reaction solution 201 on the circulation line 210a. In the present invention, during a period in which the substrate is treated by a chemical reaction in the reaction vessel 300, the concentration of the gas dissolved in the reaction solution is always maintained at or below the solubility thereof by use of the deaerating device.

This apparatus will be described in further detail.

This example is the chemical reaction apparatus for anodization, in which one surface of the substrate 200 is in contact with the reaction solution (for example, a liquid containing hydrofluoric acid) 201 and in which the other surface of the substrate 200 is in contact with an electrolyte 202, which is an electrically conductive solution, and the apparatus is provided with a negative electrode 203 for applying a negative voltage to the reaction solution 201 and a positive electrode 204 for applying a positive voltage to the conductive solution 202.

The substrate 200 is held vertically by the holding means 206a, 206b and this substrate 200 itself separates the reaction solution 201 and the electrolyte 202. However, for assuring perfect separation, sealing with seal 205, for example, of Goatex is provided between the holding means and the substrate 200.

In this example, a cooler and/or a heater, or a heat exchanger 302 is provided on the circulation line 210b as occasion may demand, and the reaction solution under circulation is heated or cooled thereby. This heating/cooling is preferably carried out so that the temperature of the reaction solution 201 in the reaction vessel 300 is kept within the variation of ±0.5° C. For that purpose, the apparatus is provided with a sensor (not shown) for detecting the temperature of the reaction solution 201 in the reaction vessel 300 and is so arranged as to adjust heating/cooling amounts by the cooler and/or heater, or heat exchanger 302, based on a signal from the sensor.

Numeral 304 designates a filter, which removes particles of 0.1 μm or more.

The deaerating device 301 used in the present invention will be described below.

Figure 3:
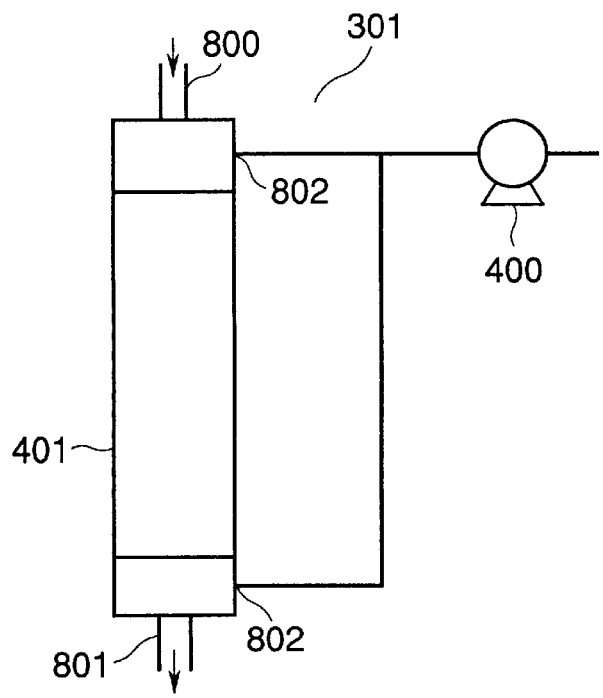
FIG. 3 is a schematic, cross-sectional view of a deaerating module used in the present invention.
Figure 4:
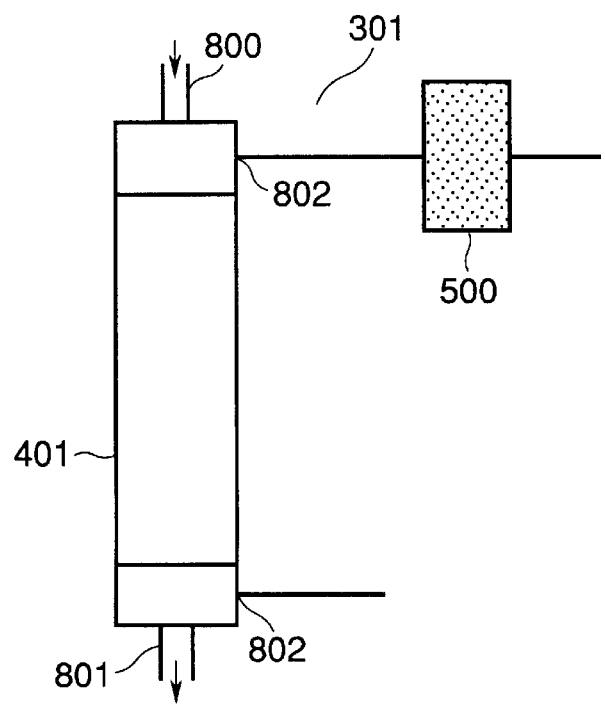
FIG. 4 is a schematic, cross-sectional view of another deaerating module used in the present invention.

Examples of the deaerating device are shown in FIG. 3 and FIG. 4.

In the example shown in FIG. 3, the deaerating device 301 is composed of a deaerating module 401 and a vacuum pump 400; in the example shown in FIG. 4, the deaerating device 301 is composed of a deaerating module 401 and a water generator 500.

Figure 8:
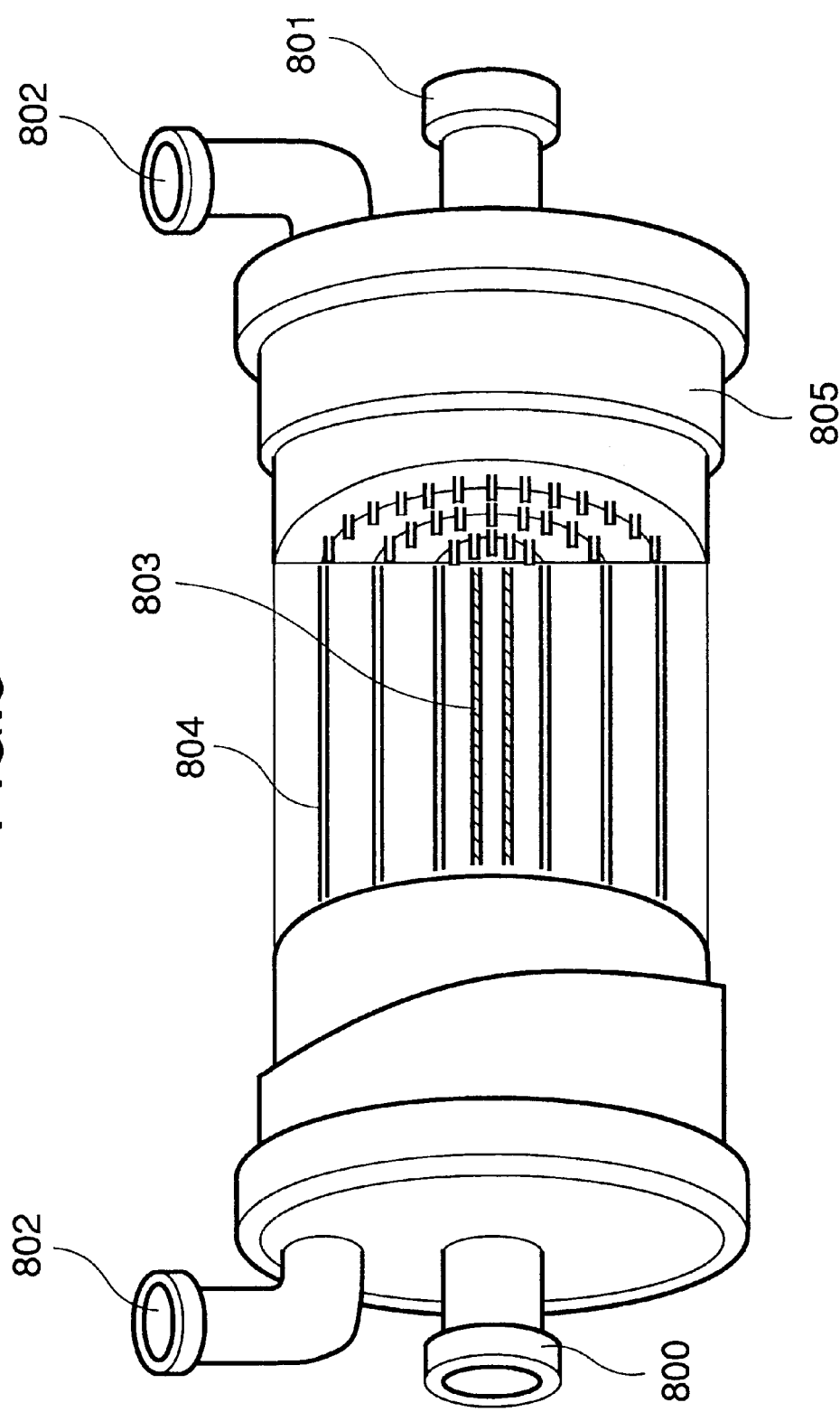
FIG. 8 is a view showing a structural example of the deaerating module.

A structural example of the deaerating module is shown in FIG. 8.

The deaerating module 401 has the structure in which hollow-fiber separation membrane sheet 804 woven like a bamboo blind is wound in a spiral form around a perforated water supply pipe 803 having many holes and located in the center, for example, as shown in FIG. 8. By forcing the reaction solution 201 to flow from a treated solution inlet 800 into the module, the reaction solution 200 radially flows through the laminated portion of the bamboo blind like member of the hollow fibers toward the periphery and goes out through a treated solution outlet 801. The hollow fiber separation membrane sheet 804 is made of, for example, a fluororesin such as PFA, and therefore does not suffer deterioration at all even if the reaction solution 200 is a hydrofluoric-acid-based reaction solution, i.e., a liquid containing hydrofluoric acid.

In the case where the deaerating device 301 is of the structure of FIG. 3, the inside of the hollow fibers is kept in a pressure reduced state by evacuating the inside by the vacuum pump 400 through hollow fiber ports 802. On this occasion, the gas dissolved in the reaction solution 200 efficiently moves from the outside to the inside of the hollow fibers while the reaction solution 200 passes through the laminated portion of the bamboo blind like member of the hollow fibers, and is discharged to the outside of the system through the vacuum pump 400.

In the case where the deaerating device 301 is of the structure of FIG. 4, ultrapure water containing no gas molecule at all, generated by the water generator 500, is forced to the hollow fiber port 802 to be discharged from the other hollow fiber port, whereby a state is kept in which the inside of the hollow fibers is filled with the ultrapure water containing no gas molecule at all. On this occasion, because of a difference between internal and external partial pressures of the gas component with respect to the hollow fibers made of a gas-permeable membrane, the gas molecules in the solution efficiently move from the outside to the inside of the hollow fibers during the period of passage through the laminated portion of the bamboo blind like member of the hollow fibers and are discharged to the outside of the system.

As the treatments utilizing chemical reactions in the present invention, there may be included such treatments as anodization, anodic oxidation, electrolytic etching, or the like. Among such treatments, examples of anodization will be described.

First described is a method for forming porous silicon or a porous silicon substrate by anodizing a single-crystal silicon substrate. The substrate is a substrate 200 comprising p-type single-crystal silicon. It is not impossible to employ the n-type, but a low-resistance substrate has to be selected in that case. The substrate 200 is set in the reaction vessel 300 as shown in FIG. 1. The reaction vessel 300 is of a completely closed type in order to avoid contact of the solution 201 or electrolyte 202 with the external air. Namely, one side of the substrate 200 is in contact with the hydrofluoric-acid-based reaction solution 201 and the negative electrode 203 is placed on the side of the reaction solution 201. On the other hand, the other side of the substrate 200 is in contact with the electrolyte 202 and the positive electrode 204 is placed on the side of the electrolyte 202. The electrolyte 202 may be any electrically conductive solution and thus may be the hydrofluoric-acid-based reaction solution. In either case the pore forming reaction takes place from the negative electrode side of the substrate 200 in contact with the hydrofluoric-acid-based solution. As the hydrofluoric-acid-based reaction solution 201, concentrated hydrofluoric acid (49 wt % HF) is normally used.

For the purpose of facilitating invasion of the hydrofluoric-acid-based reaction solution 201 into the pores of the substrate 200 having the diameter of about 10 nm during formation of porous silicon by the anodization reaction, a surfactant needs to be added into the electrolyte as the reaction solution. As the surfactant, an alcohol is desired which has the action of lowering the surface tension of the reaction solution 201 and poses no problem of adherence of the surfactant to the substrate 200 in a cleaning step after the anodization. As such an alcohol, there may be used, for example, methanol, ethanol, propanol, IPA (isopropyl alcohol), and so on. Since the above example is of the anodization of Si, the reaction solution is the liquid containing hydrofluoric acid;

however, it is a matter of course that the reaction solution can be any other non-hydrofluoric-acid-based electrolyte.

As to the negative electrode 203 or the positive electrode 204, there my be used a material that is not corroded by the hydrofluoric acid solution, for example, gold (Au), platinum (Pt), or the like.

The reaction solution 201 in the reaction vessel 300 is circulated through the deaerating device 301 and the cooler/heater 302 as shown in FIG. 2. The deaerating device 301 has the structure in which deaerating modules 401 using a gas-permeable membrane are connected in parallel.

As the gas-permeable membrane, there exist porous and non-porous ones. Since the circulated solution is the reaction solution containing alcohol serving as a surfactant, the gas-permeable membrane is desirably selected from the non-porous membranes, taking exudation of the reaction solution through the gas-permeable membrane into consideration. The deaerating modules 401 have the structure in which the hollow fiber separation membrane sheet woven like the bamboo blind is wound in the spiral form around the perforated supply pipe at the center, and the inside of the hollow fibers is kept in the pressure reduced state by the vacuum pump 400 as shown in FIG. 3. More specifically, the inside of the hollow fibers is kept in the pressure reduced state by the vacuum pump 400, and the gas molecules in the solution efficiently move from the outside to the inside of the hollow fibers during the period of passage through the laminated portions of the hollow fiber bamboo blind like member because of the pressure difference between the inside and outside of the hollow fibers constituted of the gas-permeable membrane, to be discharged through the vacuum pump 400 to the outside of the system.

The cooler/heater 302 capable of cooling or heating the solution controls the fluctuation of temperature of the reaction solution 201 in the reaction vessel 300 within ±0.5° C.

Since the above arrangement makes it possible to always control the concentration of gas molecules dissolved in the solution at or below the solubility in the chemical reaction in the solution, the gas molecules of by-product are prevented from forming bubbles in the pore forming reaction of silicon and from in turn adhering onto silicon, more specifically to the bottoms of the pores of the silicon, whereby it becomes possible to suppress degradation of chemical reaction rate and nonuniformity of chemical reaction.

Next described is a method for forming porous silicon or a porous silicon substrate by anodizing a single-crystal silicon substrate. As the substrate, is provided a substrate 200 comprising p-type single-crystal silicon. It is not impossible to employ the n-type, but a low-resistance substrate has to be selected in that case.

The substrate 200 is set in the reaction vessel 300 as shown in FIG. 1. The reaction vessel 300 is of the completely closed type in order to avoid contact of the solution 201 or electrolyte 202 with the external air. Namely, one side of the substrate 200 is in contact with the hydrofluoric-acid-based reaction solution 201 and the negative electrode 203 is placed on the side of the reaction solution 201. On the other hand, the other side of the substrate 200 is in contact with the electrolyte 202 and the positive electrode 204 is placed on the side of the electrolyte 202. The electrolyte 202 may be any electrically conductive solution and thus may be the hydrofluoric-acid-based reaction solution. In either case the pore forming reaction occurs from the negative electrode side of the substrate 200 in contact with the hydrofluoric-acid-based solution. As the hydrofluoric-acid-based reaction solution 201, concentrated hydrofluoric acid (49 wt % HF) is normally used.

For the purpose of facilitating invasion of the hydrofluoric-acid-based reaction solution 201 into the pores of the substrate 200 having the diameter of about 10 nm during formation of porous silicon by the anodization reaction, it is desirable to add the surfactant. As the surfactant, an alcohol is desired which has the action of lowering the surface tension of the reaction solution 201 and poses no problem of adherence of the surfactant to the substrate 200 in the cleaning step after the anodization. As the alcohol, there may be used, for example, methanol, ethanol, propanol, IPA, and so on.

As to the negative electrode 203 or the positive electrode 204, there may be used a material that is not corroded by the hydrofluoric acid solution, for example, gold (Au), platinum (Pt), or the like.

The reaction solution 201 in the reaction vessel 300 is circulated through the deaerating device 301 and the cooler/heater 302 as shown in FIG. 2. The deaerating device 301 has the structure in which deaerating modules 401 using the gas-permeable membrane are connected in parallel. As the gas-permeable membrane, there exist porous and non-porous ones. Since the circulated solution is the reaction solution containing alcohol serving as a surfactant, the gas-permeable membrane is desirably selected from the non-porous membranes, taking exudation of the reaction solution through the gas-permeable membrane into consideration.

The deaerating modules 401 have the structure in which the hollow fiber separation membrane sheet woven like the bamboo blind is wound in the spiral form around the perforated supply pipe at the center, and the inside of the hollow fibers is kept in the state filled with the ultrapure water containing no gas molecule at all from the water generator 500 as shown in FIG. 4. More specifically, the inside of the hollow fibers is kept in the state filled with the ultrapure water containing no gas molecule at all, and the gas molecules in the solution efficiently move from the outside to the inside of the hollow fibers during the period of passage through the laminated portions of the hollow fiber bamboo blind like member because of the difference between the internal and external partial pressures of the gas component with respect to the hollow fibers constituted of the gas-permeable membrane, to be discharged to the outside of the system.

The cooler/heater 302 controls the fluctuation of temperature of the reaction solution 201 in the reaction vessel 300 within ±0.5° C.

Since the above arrangement makes it possible to always control the concentration of gas molecules dissolved in the solution at or below the solubility in the chemical reaction in the solution, the gas molecules of by-product are prevented from forming bubbles in the pore forming reaction of a silicon wafer and from in turn adhering onto the silicon wafer, more specifically, to the bottoms of the pores of the silicon wafer, whereby it becomes possible to suppress degradation of chemical reaction rate and nonuniformity of chemical reaction.

The present invention will be described in more detail with specific examples thereof, but it should be noted that the present invention is by no means intended to be limited to these examples.

EXAMPLE 1

First prepared was the (100) single-crystal silicon substrate 200 of 6-inch p$^+$-substrate having the thickness of 625 μm, at least the surface layer of which was doped with boron in 1 to $10 \times 10^{18}$ cm$^{31\ 3}$, and the surface thereof was subjected to the anodization treatment using a p$^+$-layer of Si as an opposed electrode in a solution of HF/H$_2$O/IPA (20 to 30 wt % HF, 10 to 30 wt % IPA). The current density at that time was 5 mA/cm$^2$. As shown in FIG. 2, the reaction solution 201 in the reaction vessel 300 was circulated through the deaerating device 301 and the cooler/heater 302.

The deaerating device 301 was composed of seven deaerating modules 401 formed by use of the non-porous gas-permeable membrane, connected in parallel. The deaerating device 301 was kept in the pressure reduced state of about 10 Torr, using the vacuum pump 400. The transfer pump 303 was the one capable of circulating the reaction solution at the flow rate of 70 l/min through the chemical circulation line, i.e., capable of circulating the reaction solution at the flow rate per deaerating module of 10 l/min. Amounts of dissolved hydrogen in the reaction solution 201 in the reaction vessel 300 were observed on that occasion, and the result was that during the anodization treatment the amounts of dissolved hydrogen were always approximately 100 ppb or less, far smaller than 1 ppm being the solubility thereof. During the anodization treatment the variation of temperature of the reaction solution 201 in the reaction vessel 300 was always controlled within ±0.5° C. by actuating the cooler/heater 302.

Under the above conditions, the anodization treatment was carried out for one minute and the entire surface of the 6-inch wafer was observed with a field emission type scanning electron microscope. It was found from the observation that a layer of porous Si having the diameter of pore of 10 nm, the aperture rate of 30%, and the film thickness of 20 μm was formed with the in-plane uniformity being within the fluctuation of ±3%. Cross sections of the porous layer were also observed with a transmission electron microscope, with the result that it was confirmed that new crystal defects were not introduced into the porous layer and good single crystallinity was maintained.

EXAMPLE 2

First prepared was the (100) single-crystal silicon substrate 200 of 6-inch p$^+$-substrate having the thickness of 625 μm, at least the surface layer of which was doped with boron in 1 to $10 \times 10^{18}$ cm$^{-3}$, and the surface thereof was subjected to the anodization treatment using the p$^+$-layer of Si as an opposed electrode in the solution of HF/H$_2$O/IPA (20 to 30 wt % HF, 10 to 30 wt % IPA). The current density at that time was 5 mA/cm$^2$. As shown in FIG. 2, the reaction solution 201 in the reaction vessel 300 was circulated through the deaerating device 301 and the cooler/heater 302. The deaerating device 301 was composed of seven deaerating modules 401 formed by use of the non-porous gas-permeable membrane, connected in parallel. The deaerating device 301 was kept in the state filled with the ultrapure water containing no gas molecule at all, supplied from the water generator 500.

The transfer pump 303 was the one capable of circulating the reaction solution at the flow rate of 70 l/min through the chemical circulation line, i.e., capable of circulating the reaction solution at the flow rate per deaerating module of 10 l/min. Amounts of dissolved hydrogen in the reaction solution 201 in the reaction vessel 300 were observed on that occasion, and the result was that during the anodization treatment the amounts of dissolved hydrogen were always approximately 100 ppb or less, far smaller than 1 ppm being the solubility thereof. During the anodization treatment the variation of temperature of the reaction solution 201 in the reaction vessel 300 was always controlled within ±0.5° C. by actuating the cooler/heater 302.

Under the above conditions, the anodization treatment was carried out for one minute and the entire surface of the 6-inch wafer was observed with the field emission type scanning electron microscope. It was found from the observation that a layer of porous Si having the diameter of pore of 10 nm, the aperture rate of 30%, and the film thickness of 20 μm was formed with the in-plane uniformity being within the fluctuation of ±3%.

Cross sections of the porous layer were also observed with the transmission electron microscope, with the result that it was confirmed that new crystal defects were not introduced into the porous layer and good single crystallinity was maintained.

EXAMPLE 3

In this example the influence of deaerating amount of gas was studied.

First prepared was the (100) single-crystal silicon substrate 200 of 6-inch p$^+$-substrate having the thickness of 625

μm, at least the surface layer of which was doped with boron in 1 to 10×10$^{18}$ cm$^{-3}$, and the surface thereof was subjected to the anodization treatment using the p$^+$-layer of Si as an opposed electrode in the solution of HF/H$_2$O/IPA (20 to 30 wt % HF, 10 to 30 wt % IPA). The current density at that time was 5 mA/cm$^2$. As shown in FIG. 2, the reaction solution 201 in the reaction vessel 300 was circulated through the deaerating device 301 and the cooler/heater 302. The deaerating device 301 was composed of seven deaerating modules 401 formed by use of the non-porous gas-permeable membrane, connected in parallel. The deaerating device 301 was kept in the state filled with the ultrapure water containing no gas molecule at all, supplied from the water generator 500. During the anodization treatment the temperature variation of the reaction solution 201 in the reaction vessel 300 was always controlled within ±0.5° C. by actuating the cooler/heater 302.

Figure 5:
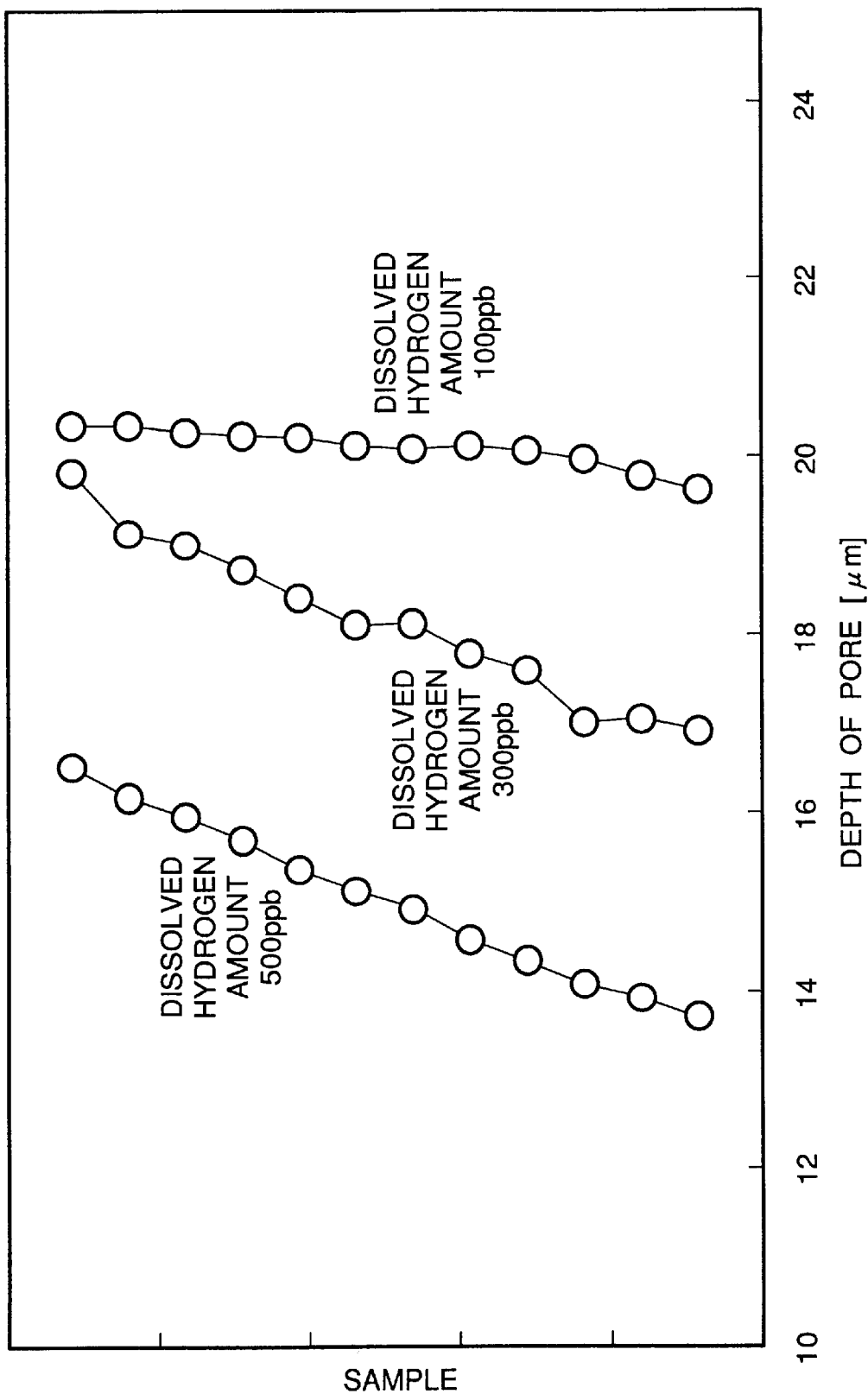
FIG. 5 is a graph showing variations in the depths of pores at respective amounts of dissolved hydrogen in Example 3.

Under the above conditions the anodization treatment was carried out for one minute at different flow rates of the transfer pump 301 ranging from 0 to 70 l/min. Amounts of dissolved hydrogen in the reaction solution 201 in the reaction vessel 300 were measured during the anodization treatment under the conditions of the respective flow rates, and after the treatment the entire surface of the 6-inch wafer was observed with the field emission type scanning electron microscope. FIG. 5 shows the dispersion in the depths of pores of the wafer in the respective amounts of dissolved hydrogen. As the amounts of dissolved hydrogen increase, the depths of pores become smaller and the dispersion in the depths of pores increases. It was found that when the amount of dissolved hydrogen in the reaction solution 201 in the reaction vessel 300 was not more than 100 ppb, the porous layer having the diameter of pore of 10 nm and the aperture rate of 30% was formed in the film thickness of 20 μm and with the in-plane uniformity of film thickness being within the dispersion of ±3% in the treatment time of one minute.

EXAMPLE 4

In this example the influence of diameter of pore was studied.

First prepared was the (100) single-crystal silicon substrate 200 of 6-inch p$^+$-substrate having the thickness of 625 μm, at least the surface layer of which was doped with boron in 1 to 10×10$^{18}$ cm$^{-3}$, and the surface thereof was subjected to the anodization treatment using the p$^+$-layer of Si as an opposed electrode in the solution of HF/H$_2$O/IPA (20 to 30 wt % HF, 10 to 30 wt % IPA). As shown in FIG. 2, the reaction solution 201 in the reaction vessel 300 was circulated through the deaerating device 301 and the cooler/heater 302. The deaerating device 301 was composed of seven deaerating modules 401 formed by use of the non-porous gas-permeable membrane, connected in parallel. The deaerating device 301 was kept in the state filled with the ultrapure water containing no gas molecule at all, supplied from the water generator 500.

The transfer pump 303 was the one capable of circulating the reaction solution at the flow rate of 35 l/min through the chemical circulation line, i.e., capable of circulating the reaction solution at the flow rate per deaerating module of 5 l/min. Amounts of dissolved hydrogen in the reaction solution 201 in the reaction vessel 300 were observed on that occasion, and the result was that during the anodization treatment the amounts of dissolved hydrogen were always approximately 600 ppb during the anodization treatment. During the anodization treatment the variation of temperature of the reaction solution 201 in the reaction vessel 300 was always controlled within ±0.5° C. by actuating the cooler/heater 302.

Under the above conditions the anodization treatment was carried out under conditions of different current densities ranging from 5 to 30 mA/cm$^2$, and the entire surface of the 6-inch wafer was observed thereafter with the field emission type scanning electron microscope.

Figure 6:
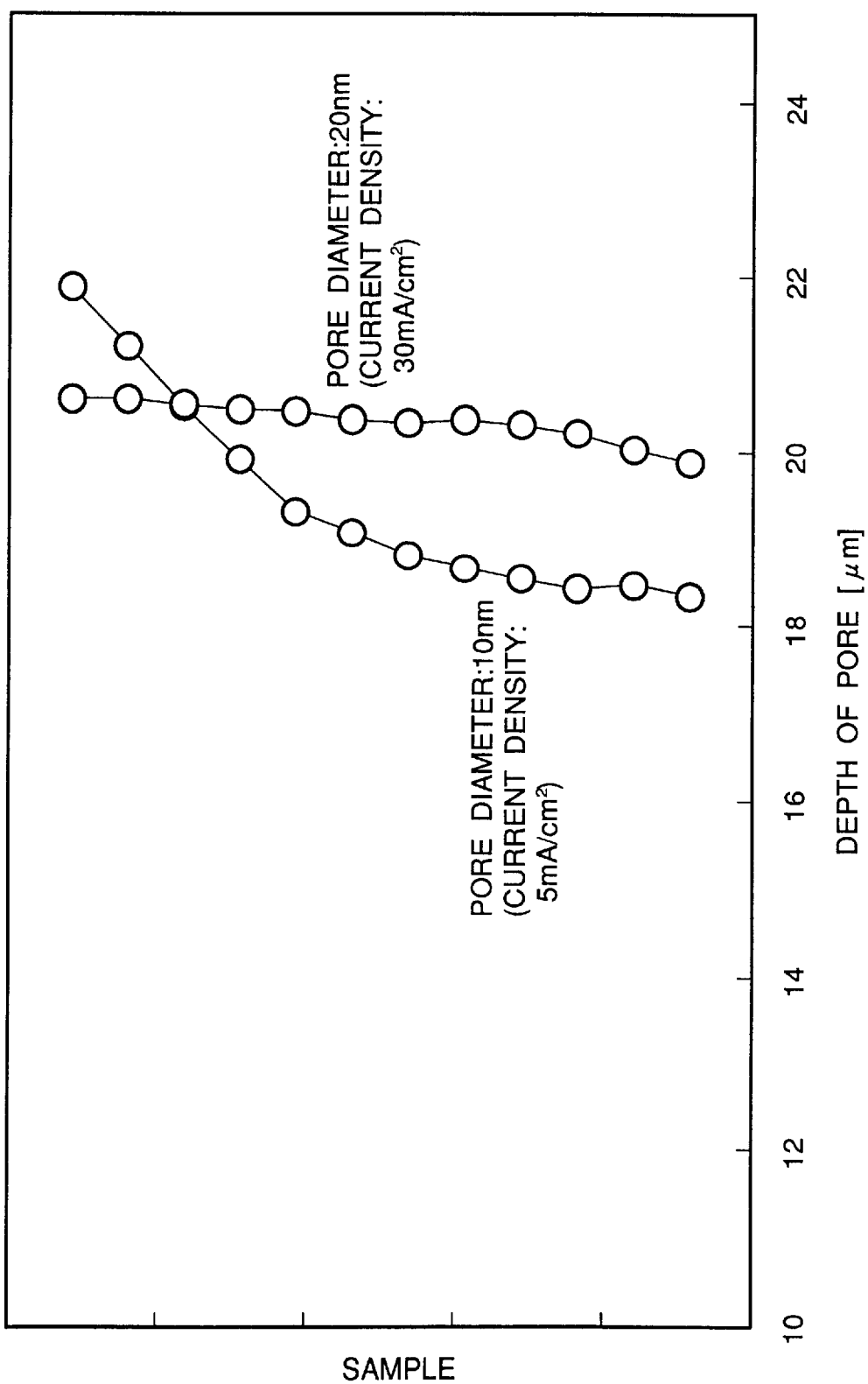
FIG. 6 is a graph showing variations in the depths of pores at respective current densities in Example 4.

FIG. 6 shows the dispersion in the depths of pores of the wafer in the respective current densities. In the anodization reaction the diameters of the pores increase with increase in the current density. It was found that when the amount of dissolved hydrogen in the reaction solution 201 in the reaction vessel 300 was 600 ppb, the fluctuation of in-plane uniformity of film thickness was restrained within ±3% in formation of the porous layer having the diameter of pore of 20 nm and the depth of pore of 20 μm, i.e., having the aspect ratio of pore of 1000. It was, however, found that the in-plane uniformity of thickness was degraded down to ±10% in the case of relatively deeper pores having the diameter of pore of 10 nm and the depth of pore of 20 μm, i.e., having the aspect ratio of pore of 2000.

EXAMPLE 5

In this example the influence of depth of pore was studied.

First prepared was the (100) single-crystal silicon substrate 200 of 6-inch p$^+$-substrate having the thickness of 625 μm, at least the surface layer of which was doped with boron in 1 to 10×10$^{18}$ cm$^{-3}$, and the surface thereof was subjected to the anodization treatment using the p$^+$-layer of Si as an opposed electrode in the solution of HF/H$_2$O/IPA (20 to 30 wt % HF, 10 to 30 wt % IPA). The current density at that time was 5 mA/cm$^2$. As shown in FIG. 2, the reaction solution 201 in the reaction vessel 300 was circulated through the deaerating device 301 and the cooler/heater 302. The deaerating device 301 was composed of seven deaerating modules 401 formed by use of the non-porous gas-permeable membrane, connected in parallel. The deaerating device 301 was kept in the state filled with the ultrapure water containing no gas molecule at all, supplied from the water generator 500. The transfer pump 303 was the one capable of circulating the reaction solution at the flow rate of 70 l/min through the chemical circulation line, i.e., capable of circulating the reaction solution at the flow rate per deaerating module of 10 l/min. Amounts of dissolved hydrogen in the reaction solution 201 in the reaction vessel 300 were observed on that occasion, and the result was that during the anodization treatment the amounts of dissolved hydrogen were always approximately 100 ppb or less, far smaller than 1 ppm being the solubility thereof. During the anodization treatment the variation of temperature of the reaction solution 201 in the reaction vessel 300 was always controlled within ±0.5° C. by actuating the cooler/heater 302.

Under the above conditions the anodization treatment was carried out under conditions of different anodization treatment times ranging from 1 to 20 minutes, and the entire surface of the 6-inch wafer was observed thereafter with the field emission type scanning electron microscope.

Figure 7:
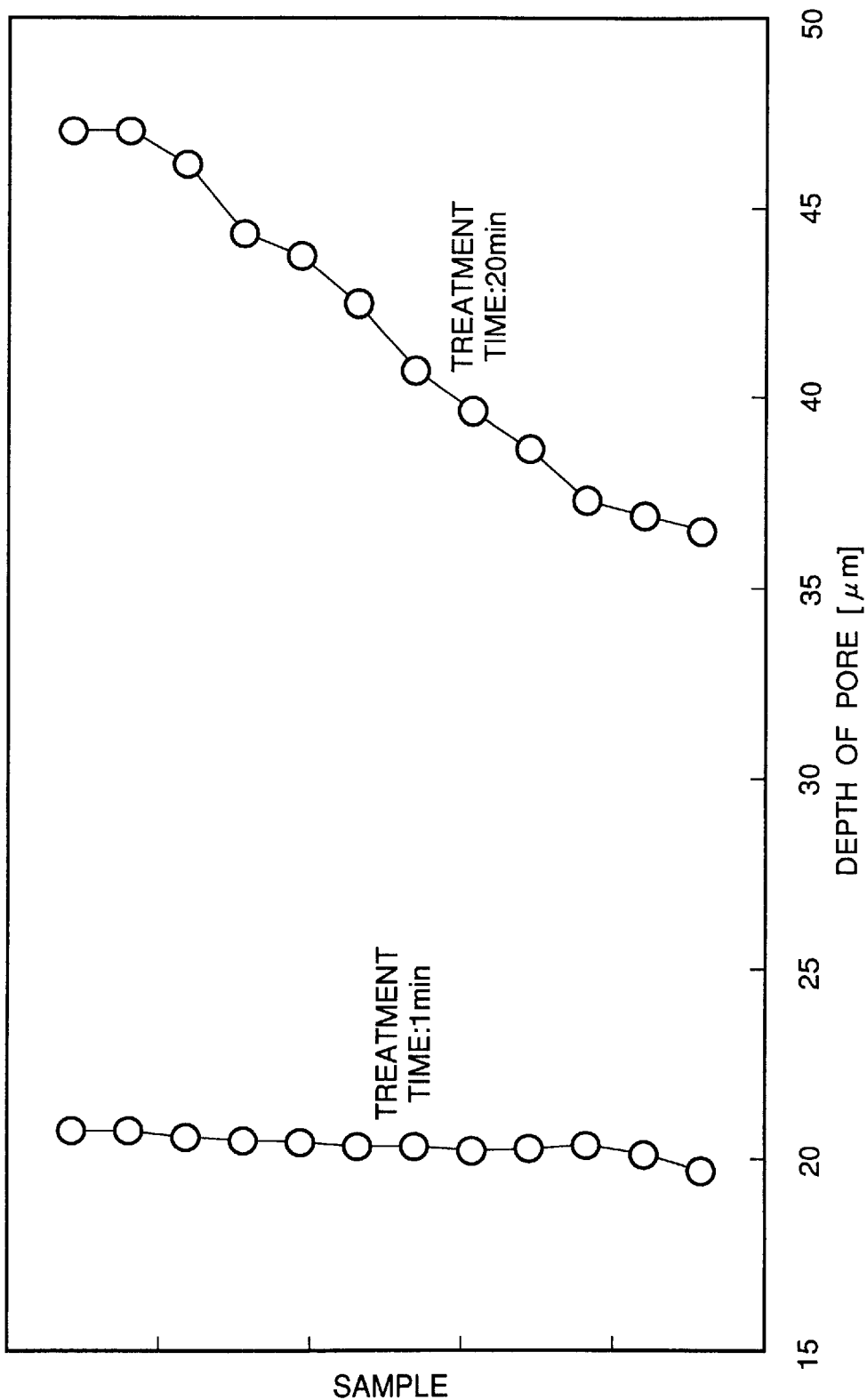
FIG. 7 is a graph showing variations in the depths of pores at respective treatment times in Example 5.

FIG. 7 shows the dispersion in the depths of pores of the wafer in the respective treatment times. In the anodization reaction the depths of the pores increase with increase in the treatment time. It was found that when the amount of dissolved hydrogen in the reaction solution 201 in the reaction vessel 300 was not more than 100 ppb, the porous layer having the diameter of pore of 10 nm and the aperture rate of 30% was formed in the thickness of 20 μm and with the in-plane uniformity of thickness being within the dispersion of ±3% in the treatment time of one minute. It was, however, found that the in-plane uniformity of thickness was degraded down to ±10% in the case of deeper pores having the diameter of pore of 10 nm and the depth of pore of 40 µm, i.e., having the aspect ratio of pore of 4000.

The present invention achieved efficient removal of gas molecules of by-product in the chemical reactions in a solution, which no conventional technologies have achieved. As a result, the present invention permits the chemical reactions in a solution to be carried out with high efficiency, high rate, and high uniformity. Further, the present invention allows production of the semiconductor substrate that can be applied to formation of the SOI structure, and the invention also permits the semiconductor substrate in which a light-emitting element or a gas sensor can be made, to be produced from an inexpensive silicon substrate.

What is claimed is:

1. A chemical reaction method, comprising performing an electrochemical reaction while always controlling the concentration of a gas of a reaction by-product dissolved in a reaction solution in a reaction vessel to be not more than the solubility thereof during the reaction by deaeration of the reaction solution, said deaeration carried out by a deaeration module comprising a gas-permeable membrane comprised of hollow fibers, wherein the hollow fibers are brought into a pressure reduced state by a pump.

2. The chemical reaction method according to claim 1, wherein the reaction solution is circulated outside the reaction vessel, and wherein deaeration of the reaction solution is carried out during circulation.

3. The chemical reaction method according to claim 1, wherein the concentration of the gas is controlled to be not more than $\frac{1}{10}$ of the solubility.

4. The chemical reaction method according to claim 1, wherein the concentration of the gas is controlled to be not more than 100 ppb.

5. The chemical reaction method according to claim 1, wherein the reaction by-product is hydrogen.

6. The chemical reaction method according to claim 1, wherein the electrochemical reaction is an anodization reaction.

7. The chemical reaction method according to claim 6, wherein the anodization reaction is a reaction for forming a porous layer in a surface of a substrate.

8. The chemical reaction method according to claim 7, wherein the substrate is held in the reaction vessel, one surface of the substrate is kept in contact with the reaction solution, the other surface of the substrate is kept in contact with an electrically conductive solution, a negative voltage is applied to the reaction solution, and a positive voltage is applied to the conductive solution.

9. The chemical reaction method according to claim 1, wherein the reaction solution in the reaction vessel is isolated from the atmosphere.

10. The chemical reaction method according to claim 9, wherein the reaction solution is a liquid containing hydrofluoric acid.

11. The chemical reaction method according to claim 7, wherein a surfactant is added into the reaction solution.

12. The chemical reaction method according to claim 11, wherein the surfactant is selected from the group consisting of methanol, ethanol and isopropyl alcohol.

13. The chemical reaction method according to claim 7, wherein the diameters of the pores are not more than 20 nm.

14. The chemical reaction method according to claim 7, wherein the depths of the pores are not less than 20 µm.

15. The chemical reaction method according to claim 7, wherein the aspect ratios of the pores are not less than 1000.

16. The chemical reaction method according to claim 7, wherein the substrate is a silicon wafer.

17. The chemical reaction method according to claim 2, wherein the deaeration is carried out by using a deaerating module comprised of a gas-permeable membrane of hollow fibers and filling the inside of the hollow fibers with ultrapure water containing no gas at all.

18. The chemical reaction method according to claim 1, wherein fluctuation of the temperature of the reaction solution is controlled within ±0.5° C.

19. A treating method, comprising performing an electrochemical reaction to treat a body to be treated while always maintaining the concentration of a gas of a reaction by-product dissolved in a reaction solution in contact with the body to be treated in a reaction vessel to be not more than the solubility thereof during the reaction by deaeration of the reaction solution, said deaeration carried out by a deaeration module comprising a gas-permeable membrane comprised of hollow fibers, wherein the hollow fibers into a pressure reduced state by a pump.

20. The treating method according to claim 19, wherein the reaction solution is circulated outside the reaction vessel, and wherein deaeration of the reaction solution is carried out during circulation.

21. The treating method according to claim 19, wherein the concentration of the gas is controlled to be not more than $\frac{1}{10}$ of the solubility.

22. The treating method according to claim 19, wherein the concentration of the gas is controlled to be not more than 100 ppb.

23. The treating method according to claim 19, wherein the reaction by-product generated is hydrogen.

24. The treating method according to claim 19, wherein the electrochemical reaction is an anodization reaction.

25. The treating method according to claim 24, wherein the anodization reaction is a reaction for forming a porous layer in a surface of the body to be treated.

26. The treating method according to claim 25, wherein one surface of the body to be treated is kept in contact with the reaction solution, the other surface thereof is kept in contact with an electrically conductive solution, a negative voltage is applied to the reaction solution, and a positive voltage is applied to the conductive solution.

27. The treating method according to claim 19, wherein the reaction solution in the reaction vessel is isolated from the atmosphere.

28. The treating method according to claim 19, wherein the reaction solution is a liquid containing hydrofluoric acid.

29. The treating method according to claim 19, wherein a surfactant is added into the reaction solution.

30. The treating method according to claim 29, wherein the surfactant is selected from the group consisting of methanol, ethanol and isopropyl alcohol.

31. The treating method according to claim 25, wherein the diameters of the pores are not more than 20 nm.

32. The treating method according to claim 25, wherein the depths of the pores are not less than 20 µm.

33. The treating method according to claim 25, wherein the aspect ratios of the pores are not less than 1000.

34. The treating method according to claim 19, wherein the body to be treated is a silicon wafer.

35. The treating method according to claim 19, wherein the deaeration is carried out by using a deaerating module comprised of a gas-permeable membrane of hollow fibers and filling the inside of the hollow fibers with ultrapure water containing no gas at all.

36. The treating method according to claim 19, wherein fluctuation of the temperature of the reaction solution is controlled within ±0.5° C.

37. A method of treating a body by an electrochemical reaction, comprising the steps of:

providing a reaction solution;

deaerating the reaction solution using a deaeration module comprising a gas-permeable membrane comprised of hollow fiber, wherein the hollow fibers are brought into a pressure reduced state by a pump so that the concentration of a gas of a reaction by-product dissolved in the reaction solution is not more than the solubility thereof; and bringing the reaction solution and the body into contact with each other and allowing an electric current to pass through the reaction solution and the body.

38. The method according to claim 37, wherein the gas is hydrogen and wherein the concentration of the gas is controlled to be not more than 1/10 of the solubility.

39. The method according to claim 37, wherein the electrochemical reaction is an anodization reaction.

40. The method according to claim 37, wherein the deaeration is carried out by using a deaerating module comprised of a gas-permeable membrane of hollow fibers and bringing the inside of the hollow fibers into a pressure reduced state with a pump.

41. The method according to claim 37, wherein the deaeration is carried out by using a deaerating module comprised of a gas-permeable membrane of hollow fibers and filling the inside of the hollow fibers with ultrapure water containing no gas at all.

42. The method according to claim 37, wherein fluctuation of the temperature of the reaction solution is controlled within ±0.5° C.

* * * * *

UNITED STATES PATENT AND TRADEMARK OFFICE
CERTIFICATE OF CORRECTION

PATENT NO. : 6,258,244 B1
DATED : July 10, 2001
INVENTOR(S) : Tadahiro Ohmi et al.

It is certified that error appears in the above-identified patent and that said Letters Patent is hereby corrected as shown below:

<u>Column 3,</u>
Line 36, "particularly" should read -- preferably --.

<u>Column 7,</u>
Line 47, "my" should read -- may --.

<u>Column 9,</u>
Line 45, "$cm^{31\ 3}$," should read -- $cm^{-3}$, --.

Signed and Sealed this

Eleventh Day of June, 2002

Attest:

JAMES E. ROGAN
Attesting Officer     *Director of the United States Patent and Trademark Office*